United States Patent [19]

Charmet

[11] Patent Number: 4,714,880
[45] Date of Patent: Dec. 22, 1987

[54] WIDE FREQUENCY PASS BAND MAGNETIC FIELD DETECTOR

[75] Inventor: Paul Charmet, Montlhery, France

[73] Assignee: Commissariat a l'Energie Atomiques, Paris, France

[21] Appl. No.: 870,872

[22] Filed: Jun. 5, 1986

[30] Foreign Application Priority Data

Jun. 7, 1985 [FR] France ............................. 85 08665

[51] Int. Cl.$^4$ ...................... G01R 33/02; H01F 17/04
[52] U.S. Cl. ................................ 324/258; 324/260; 336/84 C; 336/225
[58] Field of Search ................ 324/117 R, 127, 244, 324/258, 260; 336/84 R, 84 C, 84 M, 195, 220, 221, 225; 343/841, 842

[56] References Cited

U.S. PATENT DOCUMENTS 4,305,785 12/1981 Praeg .
4,605,899 8/1986 Eumurian et al. .................. 324/258

FOREIGN PATENT DOCUMENTS 0109867 5/1984 European Pat. Off. .

OTHER PUBLICATIONS

IEEE Transactions on Electromagnetic Compatibility, vol. EMC-16, No. 2, May 1974, "Analysis of the Moebius Loop Magnetic Field Sensor," Paul H. Duncan, Jr.
Journal of Physics E: Scientific Instruments, vol. 11, No. 1, Jan. 1978, p. 43, "Detecting Geomagnetic Pulsations Using a Solenoid with a Ferrite Core, D. F. Creighton and F. F. F. Yuan.
IEEE Transactions on Instrumentation and Measurement, vol. IM-32, No. 1, Mar. 1983, pp. 241-244, "Distributed Parameter Analysis of Shielded Loops Used for Wide-Band H-Field Measurements, James E. Lindsay, Jr., and Klaus Munter.

Primary Examiner—Gerard R. Strecker
Attorney, Agent, or Firm—Oblon, Fisher, Spivak, McClelland & Maier

[57] ABSTRACT

This detector comprises at least one bar of a ferromagnetic material about which are wound several turns of a conductive coaxial cable cut in its center into first and second portions, said portions being connected in such a way that the sheath or tube of the first portion is connected to the core of the second portion and the sheath or tube of the second portion is connected to the core of the first portion, each of the two free cable ends being used for measuring the output voltage of the detector.

9 Claims, 3 Drawing Figures

WIDE FREQUENCY PASS BAND MAGNETIC FIELD DETECTOR

BACKGROUND OF THE INVENTION

Field of the Invention

The present invention relates to a wide frequency pass band magnetic field detector.

DISCUSSION OF BACKGROUND

The invention applies to the measurements of magnetic fields, particularly in simulators with a line radiating in free space, in media greatly disturbed by electromagnetic interference and in specific equipment, e.g. subject to the interference of a simulation generator.

In per se known manner, the essential characteristics of a magnetic field detector are a time constant $\theta$ which is a function of the self-inductance L of the detector and its load resistance $R_o$, $\theta = L/R_c$, a frequency pass band limited by the high $F_h$ and low $F_b$ cut-off frequencies of the detector. The low cut-off frequency is proportional to $1/\theta$. The characteristics $\theta$ and L can easily be deduced from the geometrical dimensions of the detector.

The known magnetic field detectors have a narrow frequency pass band, the ratio between the high cut-off frequency $F_h$ and the low cut-off frequency $F_b$ being below 10, the low cut-off frequency $F_b$ being a few dozen MHz. These so-called passive and differentiating magnetic field detectors require, for the purpose of dealing with frequencies below their low cut-off frequencies $F_b$, complex electronic means making it possible to bring about an integration of the signal supplied by these detectors. Thus, the latter are dependent on supply sources, such as batteries or cells, whose autonomy hardly exceeds 1 hour due to the high power required by said electronic means and the limited space reserved for the supply, which must necessarily be integrated in a shielding system so as not to be disturbed.

The basic principle of a magnetic field detector H is based on an inductive turn diagrammatically represented in FIG. 1. The latter shows a conductor 1 wound in accordance with a loop of effective length le, of effective area surface Se and self-inductance L. The ends of the conductor 1 are interconnected by a load resistor $R_c$.

When said loop is placed in a magnetic field $\vec{H}$, an induced electric current $\vec{I}$ appears in conductor 1, whose flow direction is dependent on the direction of magnetic field $\vec{H}$ and obeys Ampere's rule. The induced output voltage $V_S$, taken at the terminals of load resistor $R_c$ is defined by the following equations established from the Norton and Thevenin Equivalent electric circuits $$V_S = \frac{Jw\, Mo\, Se\, H\, Rc}{Rc + JwL}$$

when $Rc >> Lw$ $V_S = Jw\, Mo\, Se\, H$ when $R_C << Lw$ $V_S = \frac{Mo\, Se\, H\, Rc}{L}$ in which j is defined by the relation $j^2 = -1$, $\mu$ represents the magnetic permeability of the free-space, $\omega$ the angular frequency of the field $\vec{H}$, and Se the effective area of the loop defined by:

$$Se = \frac{l_e L}{Mo}.$$

It is possible to deduce from the induced output voltage $V_S$ the value of the magnetic field $\vec{H}$ by using the above relations. The magnetic field value is the value of the field obtained along the axis of the detector.

The low cut-off frequency for which $V_S$ is attenuated by 3 db is such that $$F_b = \frac{1}{2\pi\theta} \text{ or } \omega_b = 2\pi F_b = \frac{1}{\theta}, \omega_b$$

representing the angular low cut-off frequency. For frequencies lower than $F_b$, $V_S$ undergoes an attenuation of 6 db per octave.

Thus, when $R_c >> L\omega$, the time constant $\theta$ is very small and consequently the low cut-off frequency $F_b$ is very high. Conversely, when $R_c << L\omega$, the low cut-off frequency $F_b$ is small, but the output voltage $V_S$ is almost zero and does not make it possible to deduce therefrom the value of the magnetic field $\vec{H}$. The width of the pass band of known detectors is consequently very small.

The known magnetic field detectors are generally of the cylindrical or semicylindrical type. In the first case, they are not referenced, i.e. they are not raised to a reference potential and in the second case, they are referenced with respect to earth. The conductors of these detectors are coupled together generally on a 50Ω load resistor $R_c$. These detectors have a time constant $\theta$ of approximately 2 to 5 ns and consequently a high low cut-off frequency $F_b$ of approximately 30 to 80 MHz. Moreover, the high cut-off frequency $F_h$ is in the range 200 to 500 MHz. The ratio $F_h/F_b$ between the high and low frequencies does not exceed 6, the frequency pass band of said detectors being narrow.

However, for studying disturbances by electromagnetic interference, magnetic field detectors must be able to directly detect electromagnetic signals of random form, whose frequency spectrum is wide (20 kHz to 300 MHz). Furthermore, the displacements of electric loads due to the electrical component of the electromagnetic field in which the magnetic field detectors are located induce interfering signals in the inadequately shielded conductive turns of these detectors.

The higher the working frequencies of the detectors, the more the interfering signals due to the action of the electric field $\vec{E}$ are of the same order of magnitude as the signals corresponding to the action of the magnetic field $\vec{H}$, which is prejudicial to the detection quality.

FIG. 2 diagrammatically shows a so-called Moebius coaxial turn, which is known to the Expert and which makes it possible to measure a magnetic field $\vec{H}$ by rejecting the effects due to the electrical field $\vec{E}$ as a result of the use of a coaxial cable having an adequately shielded tube or sheath.

This loop is formed by a winding of a coaxial cable 13 formed by two half-loops. These two half-loops are connected in series by connecting the sheath 6 of the first half-loop to the core 8' of the second half-loop and the core 8 of the first half-loop to the sheath 6' of the second half-loop. This inversion does not modify the coaxial structure of the cable. The tubes 6, 6' of the two ends 5, 5' which have remained free are connected together to form a common reference point C. Each of the two cores 8, 8' leading to one of the ends 5, 5' is loaded by a load resistor $R_c$ connected between the core in question and the common reference point C. Thus, there are two load resistors $R_c$, which are equal and their value is the same as that of the characteristic impedance of the coaxial cable 13, which is generally 50Ω. Thus, two symmetrical half-turns are formed.

When a magnetic field $\vec{H}$ traverses the plane formed by said loop, it produces an induced current $\vec{I}$ in each half-loop, whose direction is dependent on that of the magnetic field $\vec{H}$ and obeys Ampere's rule. The voltages induced in tubes 6, 6' (respectively in cores 8, 8') of each half-loop are symmetrical. Sheath 6, 6' of each half-loop is thus electrically coupled to the core 8, 8' of the other half-loop. This loop with the two loads $R_c$ forms a figure of eight turned on itself or an infinite loop. This arrangement imagined by the inventor Moebius makes it possible to "spread out" a coaxial cable to enable the induction to develop a voltage $V_S$ between the tube and the core. As this voltage $V_S$ makes it possible to calculate the value of the magnetic field $\vec{H}$, it can be randomly measured at the terminals of one of the load resistors $R_c$.

Thus, this coaxial Moebius turn in the presence of a magnetic field $\vec{H}$ behaves in the same way as two symmetrical voltage generators. It is adapted to its characteristic impedance and is shielded with respect to the electrical field $\vec{E}$.

The rejection of the electric field $\vec{E}$ for a given frequency improves as the turn dimensions decrease and as the transfer impedance of the coaxial cable used becomes smaller. To satisfy the latter point, the prior art generally uses a coaxial cable with a solid metal tube or sheath at least of mean or average immunity. The immunity of a cable is defined by its capacity to prevent the induction of electromagnetic signals on its core. An average or mean immunity cable is e.g. a coaxial cable, whose sheath is produced by alternating copper braiding with Mumetal tapes, particularly three copper braidings alternating with two Mumetal tapes.

This magnetic field detector formed by a Moebius loop thus rejects the parasitic effect of the electric field E and which is important or high at high frequencies. However, this detector has a frequency pass band comparable to the aforementioned detectors, i.e. it is narrow, so that the low cut-off frequencies are high.

SUMMARY OF THE INVENTION

The present invention relates to a wide frequency pass band magnetic field detector making it possible to operate with low frequencies of approximately 20 to 600 KHz and high frequencies of approximately 80 to 300 mHz, without being associated for this purpose with electronic integrating means. This detector also makes it possible to reject the parasitic effect of the electric field $\vec{E}$.

More specifically, the invention relates to a magnetic field detector, wherein it comprises at least one bar of a ferromagnetic material around which are wound several turns of a conductive coaxial cable cut in its centre into first and second portions, said portions being connected in such a way that the tube or sheath of the first portion is connected to the core of the second portion and the tube or sheath of the second portion is connected to the core of the first portion, each of the two free ends of the cable being used for measuring the output voltage of said detector.

According to an embodiment of the magnetic field detector, the number of turns on either side of the coaxial cable break is identical and is dependent on the investigated frequency range. Preferably, the coaxial cable has a characteristic impedance between 10 and 50Ω.

According to another embodiment of the magnetic field detector, it comprises an insulating covering in which are located the bar and coaxial cable, the two ends of the coaxial cable being connected in each case to a separate coaxial terminal, the tubes of these two ends also being interconnected by a common metal plate, the plate and the two coaxial terminals being accessible outside the covering.

Advantageously, the coaxial cable of the magnetic field detector has a solid metal sheath or tube so that it has a good immunity, particularly when the detector is operating at frequencies above 100 MHz. However, it is obviously possible to use other coaxial cable types, such as those having flexible multiple tubes, particularly for frequencies between 20 kHz and 80 MHz.

Preferably, the magnetic field detector comprises several ferromagnetic bars, the number of said bars being in particular a function of the investigated frequency range.

Advantageously, these ferromagnetic bars are made from different materials. A material having a low magnetic permeability $\mu$ (of approximately 250) makes it possible to operate at high frequencies and a material with a high permeability $\mu$ (approximately 1600) makes it possible to operate at low frequencies.

According to a preferred embodiment of the magnetic field detector, the ferromagnetic bar is of ferrite.

According to another preferred embodiment of the magnetic field detector, the number of turns of the coaxial cable is between 2 and 50, said number being a function of the frequency range chosen.

BRIEF DESCRIPTION OF THE DRAWINGS

The invention is described in greater detail hereinafter relative to non-limitative embodiments and the attached drawings, wherein show.

DETAILED DESCRIPTION OF THE PREFERRED EMBODIMENTS

Figure 1:
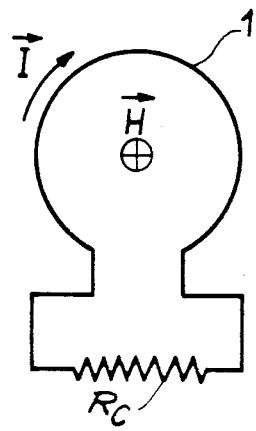
FIG. 1, already described, diagrammatically a loop of a conductor making it possible to detect a magnetic field of per se known type.
Figure 3:
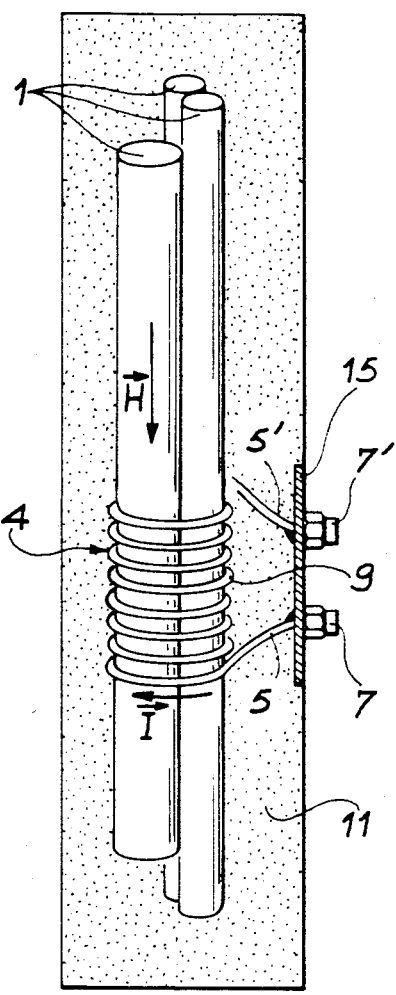
FIG. 3, diagrammatically an example of a magnetic field detector according to the invention.

FIG. 3 shows three ferromagnetic bars 1 about which are wound, in a single layer, eight turns 4 or windings of a conductive coaxial cable, which is cut at its centre 9 (i.e. at a point midway between its ends) so as to form an inversion of the same type as that of the Moebius loop. Thus, the coaxial cable is cut at its center or midpoint into two halves, the sheath or tube of the first half being connected to the core of the second half and the core of the first half is connected to the tube or sheath of the second half.

This cable is generally wound onto an insulating matrix, which is not shown for clarity reasons. This matrix can be of random shape, e.g. cylindrical, the bars being placed in the centre of the matrix along the longitudinal axis thereof.

Moreover, FIG. 3 shows regularly wound circular turns, but this example is clearly not limitative. Thus, the turns can be of random form, adapting to the shape of the matrix onto which they are wound and they can be distributed in accordance with a random spacing and even a variable spacing system.

Figure 2:
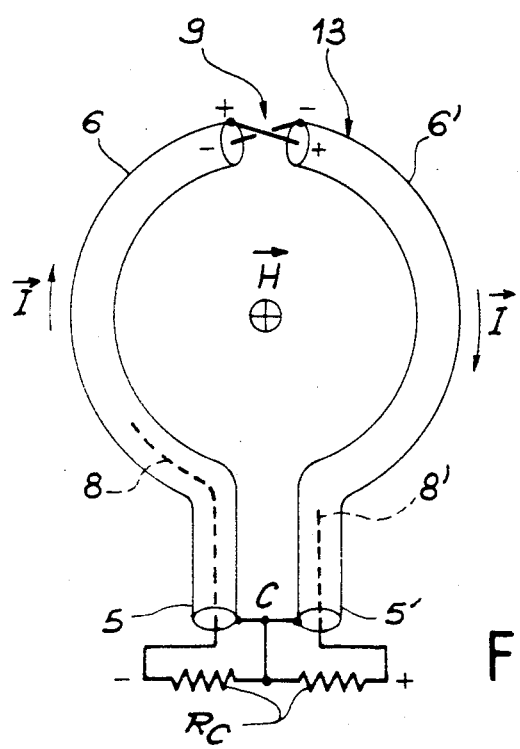
FIG. 2, already described, diagrammatically a known magnetic field detector formed by a coaxial Moebius loop.

The two free cable ends 5, 5' are respectively connected to coaxial terminals 7, 7'. The core and tube of each end of the cable are respectively connected to the core and tube of the coaxial terminal associated therewith. The tubes of the two ends 5, 5' are also interconnected by a common metal plate 15, which is e.g. of copper. Each coaxial terminal is connected to a load resistor $R_c$ of the same type as shown in FIG. 2 and equal to the characteristic impedance of the coaxial cable. Each of the two coaxial terminals 7, 7' makes it possible to measure the induced output voltage $\underline{V}_S$ of said detector in the presence of a magnetic field $\vec{H}$.

This embodiment is obviously not limitative and it is in fact also possible to directly connect together the two ends of the tube, upstream of their connection to the metal plate 15. This connecting method is advantageous, because it makes it possible to preserve the continuity of the coaxial structure of the cable, particularly when the coaxial terminals 7, 7' are remote from one another.

The assembly comprising bars 1 and the coaxial cable windings 4 is placed in a covering 11 of a non-corrosive insulating material, e.g. a plastics material. Only the coaxial cable ends are accessible outside said covering 11 via the coaxial terminals 7, 7' and the metal plate 15. The thus formed detector can be placed in a random working medium and particularly in air.

When the magnetic field detector according to the invention is placed in a magnetic field $\vec{H}$, the lines of force of this field pass through the detector according to direction formed by the ferromagnetic bars 1. This magnetic field $\vec{H}$ then induces an electric current $\vec{I}$ traversing the winding 4 of the coaxial cable. The flow direction of current $\vec{I}$ is dependent on the direction of the magnetic field $\vec{H}$ and obeys Ampere's law. The induced output voltage $V_S$ measured at one of the two ends 5, 5' of the coaxial cable, respectively via coaxial terminals 7, 7' to which they are connected, makes it possible to deduce therefrom the value of the magnetic field H. It is obvious that on taking the output voltage between the two coaxial terminal 7, 7', a voltage equal to 2 $V_S$ is obtained, provided that the two coaxial terminals 7, 7' are connected to a load resistor of $4R_c$.

In the detector according to the invention, the use of an inversion of the same type as that of the Moebius loop with windings of a coaxial cable weakly sensitive to the electric field, such as a coaxial cable with a solid metal sheath, makes it possible to reject the parasitic effect of the electric field $\vec{E}$.

Moreover, the use of several turns 4 wound around ferromagnetic bars 1 makes it possible to increase the value of the self-inductance L of the detector and consequently increase the time constant $\theta = L/R_c$ of said detector. This increase to $\theta$ leads to a decrease in the low cut-off frequency $F_b = \frac{1}{2}\pi\theta$. FIG. 3, which shows eight turns 4 and three bars 1 is only an exemplified embodiment, it being possible to use more or less turns and bars.

The use of several turns makes it possible to increase the inductance L of the detector assembly through the auto-induction effect L' between the turns. Thus, the auto-induction L' is proportional to the square of the number of turns. Thus, the number of turns 4 conditions the value of the low cut-off frequency $F_b$ of the detector. The increase to the induction L of the detector assembly by auto-induction is limited through the use of an inversion of the same type as that of the Mobius loop separating into two half-coils the turns 4 for forming 2 symmetrical voltage generators. It is therefore advantageous to use between 2 and 50 turns.

The introduction of ferromagnetic bars 1 in the centre of the windings 4 of the coaxial cable also makes it possible to increase the inductance L of the detector assembly, whilst rendering uniform the coupling constants produced by the turns 4. Thus, the coupling phenomena between the magnetic field $\vec{H}$ and each turn 4 are disturbed by the coupling effects between the different turns used, so that there is a significant limitation to the high cut-off frequency $F_h$.

The introduction of ferromagnetic bars 1 channels the lines of force in the direction of said bars 1 and increases the same. Thus, bars 1 make it possible to render uniform the coupling constants and increase the induction L of the detector assembly by the permeability of said bars 1. The increase in the induction L as a function of the number of bars tends towards a limit value due to the high reluctance of the open magnetic circuit of the detector according to the invention.

The ferromagnetic bars 1 used can have different diameters and lengths as a function of the manufacturer, only the volume of said bars influencing the detector induction L. The number of bars 1 used is consequently more particularly dependent on the respective volume of said bars and the internal volume of the matrix onto which the coaxial cable is wound.

Moreover, as a function of the type of ferromagnetic materials used for forming these bars, it is possible to investigate different frequency ranges. Thus, a ferromagnetic material of low permeability $\mu$ of approximatly 250 makes it possible to operate with high frequencies, whereas a ferromagnetic material with a high permeability $\mu$ of approximately 1600 makes it possible to work with low frequencies.

As has been shown hereinbefore, the time constant $\theta$ of a detector is equal to $L/R_c$. Thus, by reducing the characteristic impedance of the coaxial cable and the load resistance $R_c$, it is also possible to increase the time constant $\theta$ of the detector and therefore reduce the low cut-off frequency. This characteristic impedance, generally 50$\Omega$ is therefore preferably chosen lower and e.g. approximately 10$\Omega$.

Thus, the detectors according to the invention have frequency pass bands widened towards low cut-off frequencies compared with the frequency pass bands of the prior art detectors. The low cut-off frequencies of the detectors according to the invention have been divided by a coefficient between approximately 100 and more than 500 compared with the low cut-off frequencies of the prior art detectors with out decreasing in a prejudicial manner their high cut-off frequencies.

Thus, the detectors according to the invention have the following main characteristics:

$\theta$ between approximately 250 ns and 8 us, $F_h$ between approximately 80 and 300 MHz, $F_b$ between approximately 20 and 600 kHz, $F_h/F_b$ between approximately 500 and 4000.

As shown hereinbefore, these characteristics are particularly dependent on the inductance L of the detector and the characteristic impedance $R_c$ of the coaxial cable, the inductance L being a function of the number turns, the number of bars and the nature of the magnetic materials.

On taking as an example a coaxial cable with a characteristic impedance of 50Ω, which is wound according to the invention in eight turns with a diameter of approximately 4 cm around three ferromagnetic bars, two of which have a length of 20 cm, a diameter of 1 cm and a permeability of 250 and whereof the third has a length of 15 cm, a diameter of 1.5 cm and a permeability of 1600, a low cut-off frequency of approximately 200 kHz is obtained and a high cut-off frequency of approximately 200 MHz.

According to another example, on taking a coaxial cable with a characteristic impedance of 15Ω which is wound in accordance with the invention in the form of 21 turns of diameter 4 cm around seven bars, six of which have a length of 20 cm, a diameter of 1 cm and a permeability of 250 and whereof the seventh has a length of 15 cm, a diameter of 1.5 cm and a permeability of 1600, a low cut-off frequency of approximately 20 kHz and a high cut-off frequency of approximately 80 MHz are obtained. The resulting ratio $F_h/F_b$ is approximately 4000, which is considerable compared with the ratio of approximately 1200 which would be obtained under the same conditions using a coaxial cable with an identical sheath and a characteristic impedance of 50Ω and particularly when compared with ratio of 6 obtained with the prior art magnetic field detectors.

With two coupled detectors according to the invention, it is consequently possible to work in a frequency range between 20 kHz and 300 MHz.

The magnetic field detectors according to the invention are very simple to produce. They make it possible to reject the parasitic effect of the electric field $\vec{E}$ and to operate in a wide frequency range, particularly at low frequencies which can drop below 20 kHz. Moreover, the fact of not using a sophisticated electronic device and energy source gives it an unlimited autonomy. These advantages are of particular interest in the special case where said detectors are e.g. used for controlling the electromagnetic signals emitted by simulators, for detecting electromagnetic interference from any source and for determining the effectiveness of electromagnetic shieldings of electronic devices.

What is claimed is:

1. A magnetic field detector comprising:
   at least one bar of a ferromagnetic material about which are wound in a single layer several loops of a conductive coaxial cable which is cut at a point midway between the two ends of said cable into half-portions including a first portion and a second portion wherein said first and second portions are connected in such a way that the sheath of the first portion is connected to the core of the second portion and the sheath of the second portion is connected to the core of the first portion, each of said ends of the cable being used for measuring an output voltage of the detector, said voltage being indicative of a magnetic field to be detected.

2. A magnetic field detector according to claim 1, wherein the number of loops of said two half portions is identical and is dependent on the frequency range investigated.

3. A magnetic field detector according to claim 1, wherein the coaxial cable has a characteristic impedance between 10 and 50Ω.

4. A magnetic field detector according to claim 1, wherein an insulating covering, in which are located the bar and the coaxial cable, is provided the two ends of the coaxial cable being in each case connected to a separate coaxial terminal, the sheath of said two ends also being interconnected by a common metal plate, the plate and the two coaxial terminals being accessible outside the covering.

5. A magnetic field detector accoring to claim 1, wherein the coaxial cable has a solid metal sheath.

6. A magnetic field detector according to claim 1, wherein several bars are provided.

7. A magnetic field detector according to claim 6, wherein the bars are made from different ferromagnetic materials.

8. A magnetic field detector according to claim 1, wherein the bar is made from ferrite.

9. A magnetic field detector according to claim 1, wherein the cable has 2 to 50 loops.

* * * * *